(12) United States Patent
Ferstl

(10) Patent No.: US 7,502,399 B2
(45) Date of Patent: Mar. 10, 2009

(54) PACKAGE FOR A LASER DIODE COMPONENT, LASER DIODE COMPONENT AND METHOD FOR PRODUCING LASER DIODE COMPONENT

(75) Inventor: Christian Ferstl, Neutraubling (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/484,441

(22) Filed: Jul. 11, 2006
(Under 37 CFR 1.47)

(65) Prior Publication Data

US 2007/0091945 A1    Apr. 26, 2007

(30) Foreign Application Priority Data

Jul. 11, 2005    (DE) .................. 10 2005 032 305
Aug. 2, 2005    (DE) .................. 10 2005 036 266

(51) Int. Cl.
*H01S 3/00* (2006.01)
(52) U.S. Cl. .................. 372/38.01; 372/65; 372/103
(58) Field of Classification Search .............. 372/38.01, 372/65, 103
See application file for complete search history.

(56) References Cited

U.S. PATENT DOCUMENTS

| 6,220,765 | B1 * | 4/2001 | Tatoh .......................... 385/94 |
| 6,659,659 | B1 | 12/2003 | Malone |
| 6,778,576 | B1 | 8/2004 | Acklin et al. |
| 2003/0035359 | A1 * | 2/2003 | Jeong et al. ............ 369/112.04 |
| 2003/0156608 | A1 | 8/2003 | Ido et al. |
| 2004/0136001 | A1 | 7/2004 | Nishimura |
| 2005/0074046 | A1 | 4/2005 | Kasai |
| 2008/0084905 | A1 * | 4/2008 | Doerfel et al. ........... 372/43.01 |

FOREIGN PATENT DOCUMENTS

DE    199 44 042 A1    4/2001

(Continued)

OTHER PUBLICATIONS

Koechner, W., "Solid State Laser Engineering", 4th extensively revised and updated edition, Springer Series in Optical Sciences 1996, pp. 312-313.

(Continued)

*Primary Examiner*—Dung T Nguyen
(74) *Attorney, Agent, or Firm*—Cohen Pontani Lieberman & Pavane LLP

(57) ABSTRACT

A package for a laser diode component is described. This comprises a carrier, which has on a front side a mounting region for a laser diode chip or laser diode bar, and at least one holding device, which is arranged on the carrier and has at least one aperture, in which an electrical terminal conductor is held. The holding device is designed for surface mounting. Moreover, a laser diode component with such a package and a method for producing a laser diode component are described. In the method, preferably a plurality of carriers are provided together in an interconnected assembly and are loaded with laser diodes. Subsequently, holding devices each with at least one electrical terminal conductor are fitted on the carriers.

57 Claims, 7 Drawing Sheets

FOREIGN PATENT DOCUMENTS

| | | |
|---|---|---|
| DE | 101 17 890 A1 | 10/2002 |
| DE | 10 2004 051 362 A1 | 4/2006 |
| EP | 1 309 048 A1 | 5/2003 |
| JP | 2002-109774 A | 4/2002 |
| WO | WO 2004/107511 A2 | 12/2004 |
| WO | WO 2005/093853 A1 | 10/2005 |

OTHER PUBLICATIONS

Search Report issued for a corresponding European Patent Application No. 06 01 1753.

European Search Report issued in the corresponding foreign application No. EP 06 01 1753.

* cited by examiner

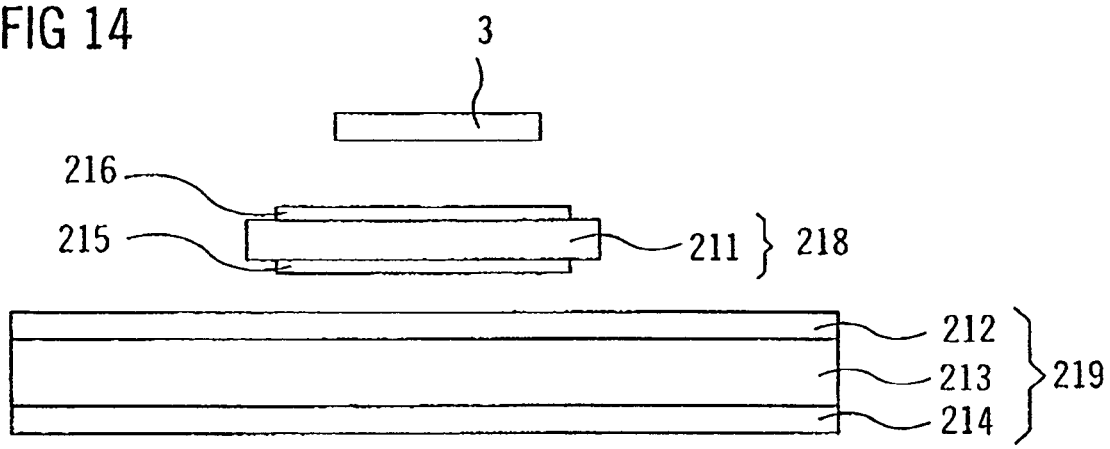
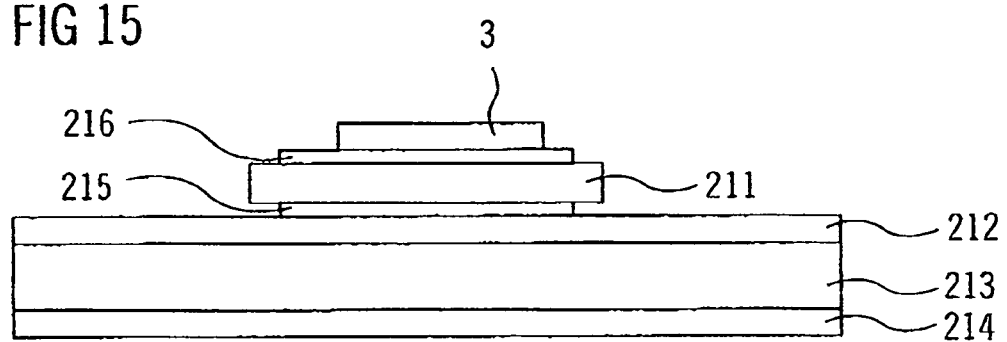

PACKAGE FOR A LASER DIODE COMPONENT, LASER DIODE COMPONENT AND METHOD FOR PRODUCING LASER DIODE COMPONENT

RELATED APPLICATIONS

This patent application claims the priority of German patent applications 102005032305.7 and 102005036266.4 filed Jul. 11, 2005 and Aug. 2, 2005, respectively, the disclosure of which is hereby incorporated by reference.

FIELD OF THE INVENTION

The invention relates to a package for a laser diode component and to a laser diode component with such a package. Moreover, a method for producing a laser diode component is specified.

BACKGROUND OF THE INVENTION

There are known packages for laser diode components in which straight electrical terminal pins are attached to a package carrier or led through the package carrier in such a way that, on an outer side of the package, they protrude perpendicularly away from the package carrier. Such packages are formed in particular as metal packages. They generally have a metal cladding, which serves the purpose of protecting the laser diode chip or laser diode bar from external influences.

Metal packages of this type are suitable for laser diode components which in cw mode ("continuous wave mode") have a thermal power loss of the order of 1 W. Laser diode chips or laser diode bars with higher power losses, which lie for example in a range between 20 W and 100 W, inclusive, are usually installed in expensive special packages. Examples of these are so-called HHL packages ("high heat load packages") or special packages designed for specific applications.

SUMMARY OF THE INVENTION

It is an object of the present invention to provide a package for a laser diode component that can be produced at low cost and can be easily handled, with which in particular a laser diode component can be produced with high precision in a technically simple manner.

A package for a laser diode component with a carrier and at least one holding device arranged on the carrier is specified. The package is designed for surface mounting. The holding device has at least one aperture, in which an electrical terminal conductor is held.

An aperture is to be understood in the present case as meaning an opening or a clearance in a holding device. The aperture extends in particular from an outer side to an inner side of the holding device. The inner side of the holding device is facing a mounting region for at least one laser diode chip or laser diode bar, the outer side is facing away from the mounting region. The term "carrier" is to be understood in particular as meaning a package carrier or a basic carrying body of the package.

The electrical terminal conductor is preferably inserted through the aperture and fastened in it. The aperture advantageously has for this purpose a greater cross-sectional area than part of the electrical terminal conductor, so that the latter can be inserted through the aperture in a simple manner.

The electrical terminal conductor advantageously comprises a wide part and a narrow part, the narrow part having a smaller width than the wide part. The narrow part is held in the aperture in such a way that the wide part is arranged on the outer side of the holding device. The wide part of the electrical terminal conductor comprises in particular a package connection part, at which the package can be connected in an electrically conducting manner by means of surface mounting. It preferably has a strip-like form.

In an expedient embodiment, the electrical terminal conductor is fixed in the aperture by means of a filling material. The filling material is preferably electrically insulating, so that the holding device may comprise electrically conducting material or consist of such material even if two or more electrical terminal conductors are held on it or in it. The use of the electrically insulating filling material allows the risk of a short-circuit to be significantly reduced or avoided.

In an expedient embodiment, the carrier has on the front side a mounting region for the laser diode chip or laser diode bar, it preferably being provided that these are mounted directly on the mounting region. However, it is also possible to mount the laser diode chip or the laser diode bar indirectly on the mounting region, for example by means of a corresponding additional holder.

It is particularly advantageous for the carrier and the holding device to be formed as separate parts. This makes it possible for example in the production of a laser diode component firstly to mount a laser diode chip or laser diode bar on the carrier and subsequently to arrange the holding device with the electrical terminal conductor on the carrier. For this purpose, the holding device may for example be placed on.

With particular preference, the package has at least two electrical terminal conductors, which are respectively held by means of the holding device. The electrical terminal conductors are held in particular in each case in an aperture of the at least one holding device.

According to a particularly expedient embodiment, the package has a simple construction, in which the carrier is particularly advantageously free of electrical terminal conductors. The electrical terminal conductor or the electrical terminal conductors is or are preferably kept at a distance from the carrier. With particular preference, the terminal conductor or terminal conductors protrudes or protrude freely over the front side of the carrier.

According to an advantageous embodiment, a component connection part of the electrical terminal conductor is kept laterally at a distance from the carrier. "Laterally" is to be understood in this connection as meaning directions which run parallel to a plane in which the carrier mainly extends. This measure has the effect that the package is free of the component connection part and can for example be used exclusively for thermal connection.

The electrical terminal conductor is particularly advantageously electrically insulated from at least one part of the carrier. This applies with particular advantage to at least two electrical terminal conductors of the package.

Both the holding device and the carrier are suitable for the use of many different materials. The holding device preferably includes a metallic and/or ceramic material. In addition or alternatively, the carrier includes metallic and/or ceramic material.

Such materials have the advantage of being resistant to high temperatures, which may occur for example in soldering operations. Ceramic and/or metallic materials that are used preferably have a high thermal conductivity. According to an expedient embodiment, the package is designed for ambient temperatures of up to 125° C. With particular preference, the package is free of plastic.

According to a further advantageous embodiment, the carrier is formed as a heat dissipating element, for dissipating heat which occurs during operation of a laser diode chip or laser diode bar mounted in the package. With particular advantage, a rear side of the carrier, opposite from the front side, has a thermal connection area. In particular, the entire rear area of the carrier may be used as a thermal connection area. The rear side of the carrier is the side facing away from a mounting region for the laser diode chip or laser diode bar.

With particular preference, the thermal connection area is electrically insulated from electrical terminal conductors of the package. This allows an electrical and spatial separation of the heat dissipation and electrical contacting in the package or in the component to be achieved, which may be advantageous for the electrical and thermal connection of the package or the component. For example, the component can consequently be thermally connected to areas independently of the electrical potential that these areas are under.

The holding device preferably consists substantially of metallic material. According to this embodiment, the holding device consists at least in great part, that is to say at least 50%, of metallic material. Metallic material has the advantage not only of being heat-resistant but also of being mechanically stable. Moreover, it is possible to set a desired coefficient of thermal expansion for the holding device by forming and using special alloys. The coefficient of thermal expansion is preferably as low as possible.

The holding device advantageously includes at least one of the materials nickel, iron and cobalt. With particular preference, an alloy which includes at least two of these materials is provided. With such alloys, particularly low coefficients of thermal expansion can be achieved.

Also specified is a package in which the holding device is provided with a coating which is suitable for reflecting electromagnetic radiation. Consequently, the holding device can advantageously act additionally as a reflector. The coating preferably includes metallic material or consists of metallic material. In addition or alternatively, the coating has a layer sequence for a Bragg mirror.

According to a further embodiment, the holding device has a reflector bevel, which runs obliquely in relation to a plane of principal extent of the carrier. The reflector bevel is advantageous in particular for the use of edge-emitting laser diodes, the electromagnetic radiation of which can be deflected in an emitting direction within the package by means of the reflector bevel.

The reflector bevel is preferably impressed in the holding device. This is possible for example if the holding device consists of metallic material, at least in the part that is intended for the reflector bevel. The reflector bevel is advantageously provided additionally or alternatively with reflective material. It is advantageously possible to dispense with the incorporation of a separate deflecting element in the package.

According to an expedient embodiment, the reflector bevel is provided with reflective material in the form of a reflector plate. The reflector plate is formed in particular in a planar manner. The use of a reflector plate allows a particularly high-quality reflector to be formed on the reflector bevel in a technically simple manner.

In an advantageous embodiment, the reflector bevel has a concave curvature. Such a concave curvature allows the reflector bevel to serve not only for simply deflecting electromagnetic radiation but for example in addition for focusing and/or homogenizing a beam. The curvature may in particular also be impressed.

The carrier advantageously has a first carrier layer with a mounting region for a laser diode chip or a laser diode bar, which layer is connected on a side facing away from the mounting region to a second carrier layer of the carrier by means of a hard solder. With particular preference, the second carrier layer includes a metallic material or consists of such a material.

In addition or alternatively, the carrier has with particular advantage two carrier layers with metallic material and a carrier layer with ceramic material arranged between these carrier layers. One of these carrier layers with metallic material may form in particular the aforementioned second carrier layer.

Furthermore, a package in which the holding device is formed as a frame for the package is specified. This allows a laser diode that is to be mounted to be protected from external influences.

It is altogether possible with the concepts presented here for the holding device in a package to perform, for example, three functions simultaneously. One possible function is to hold at least one electrical terminal conductor. A further possible function is to form a frame for the package. Finally, the holding device may additionally or alternatively perform the function of beam deflection or of a mirror. The holding device performs one, some or all of these functions. The integration of a number of functions in a single element allows the construction and the production of the package to be simplified in comparison with conventional packages.

The package is advantageously designed or suitable for a laser diode component with a thermal power loss of greater than or equal to 3 W, preferably greater than or equal to 5 W. With particular preference, the package is designed or suitable for a laser diode component with a thermal power loss of greater than or equal to 6 W. With the package, this is possible in particular as a result of its simple construction with a carrier and a holding device. The simple construction particularly allows the carrier to be optimized with regard to good heat dissipation to a greater degree than is the case with many conventional packages for laser diode components.

A laser diode component which has the package and at least one laser diode chip or laser diode bar is specified. As already described above, the laser diode chip or the laser diode bar may be mounted directly or indirectly on the carrier. For indirect mounting, it is possible for example to use a holding element on which the laser diode can for example also be mounted in such a way that its plane of principal extent extends perpendicularly in relation to a plane of principal extent of the carrier. However, the laser diode is preferably mounted in such a way that its plane of principal extent runs parallel to a plane of principal extent of the carrier.

The laser diode component preferably has at least one edge-emitting laser diode chip or laser diode bar, that is to say the laser diode emits substantially horizontally, with respect to its plane of principal extent.

With particular advantage, the laser diode component has a thermal power loss of greater than or equal to 3 W, preferably of greater than or equal to 5 W and particularly preferably of greater than or equal to 6 W. All figures given for thermal power losses apply in particular to the case in which the laser diode component is operated in the cw mode ("continuous wave mode").

In an expedient embodiment, a covering body is fitted on the holding device of the laser diode component. This covering body preferably has at least one radiation-transmissive window. The covering body is preferably formed as an optical element. Alternatively, an optical element is arranged on the covering body. The simple construction of the package allows the covering body and any optical element that may be connected to it to be adjusted particularly precisely in relation to the laser diode.

In an expedient embodiment, the optical element has at least one lens.

According to a particularly advantageous embodiment, the optical element has a number of structural elements. The structural elements preferably include micro-lenses, lens structures, structures such as for a Fresnel lens and/or roughenings. Linear structures are to be understood as meaning structures with an elongate, line-like form. Structures such as for a Fresnel lens particularly also include structures of a Fresnel lens itself, the feature also comprising modifications of such structures. Such modifications may be obtained in particular by combinations of different structural elements with one another.

The optical element with the structural elements is particularly suitable for homogenizing the laser beam to be emitted. Particularly edge-emitting lasers often emit a laser beam with a strongly anisotropic beam cross section, which often has an elliptical form. In a preferred embodiment, the optical element is suitable for significantly reducing the anisotropy of the beam cross section. Homogenizing means bringing about a spatially more uniform distribution of the radiation intensity of the laser beam emitted.

According to a particularly advantageous embodiment, the covering body additionally or alternatively has a Bragg mirror. With the Bragg mirror, electromagnetic radiation of a desired, narrow frequency range can be selectively reflected. The Bragg mirror may form an external resonator mirror for the laser diode chip or laser diode bar, by means of which a desired frequency range of the laser diode chip that is to be emitted can be set. Such an external resonator mirror allows for example temperature influences on the laser diode component to be at least partially compensated.

In a particularly expedient embodiment, an optical system is arranged on the carrier and in a beam path of the laser diode chip or laser diode bar. This allows the properties of the laser beam that is to be emitted to be influenced already in the vicinity of the laser diode chip or laser diode bar.

In the method, a carrier is provided and a laser diode chip or laser diode bar is mounted directly or indirectly on the carrier. The laser diode component to be produced is designed for surface mounting.

It is consequently a surface mountable component, which may also be referred to as an SMD component (SMD="surface mountable device"). In this connection, reference is also made to surface mounting technology (SMT).

According to an embodiment of the method, at least one holding device is provided, at least one aperture is formed in the holding device and an electrical terminal conductor is fastened in the aperture. Moreover, this embodiment of the method comprises placing the holding device onto the carrier.

A further advantageous embodiment of the invention provides that the carrier is provided together with a holding device arranged on a front side of the carrier. In this method, the carrier and the holding device may particularly also be formed in one piece with each other. At least one aperture is formed in the holding device. The electrical terminal conductor is advantageously only fastened on the holding device after a laser diode chip or laser diode bar has been mounted on the carrier.

The individual method steps may in principle, wherever physically possible, be carried out in any desired sequence. The sequence in which individual method steps are described within this application does not dictate the sequence in which the individual method steps are to be carried out. This applies in particular to the statements made in the patent claims.

With particular advantage, in the method a reflector bevel is incorporated in the holding device. Such a method step can for example take the place of providing and mounting a separate deflecting element.

The carrier is preferably provided in an interconnected assembly with many other carriers. With particular advantage, the mounting of the laser diode on the carrier takes place "as a repeat", that is to say in a stage of the method in which the carriers are still together in the interconnected assembly. With particular preference, the holding device is also fitted on before the carriers are singulated from their interconnected assembly.

This is advantageously a particularly low-cost way of loading components on the carrier. Moreover, it creates the possibility of a particularly precise arrangement of the chip or the bar on the carrier, since the latter is free of the holding device and the electrical terminal conductor when components are loaded, and is consequently particularly easily accessible.

It is particularly preferred if, in the method, a plurality of identical or similar light emitting diode components are produced substantially simultaneously. The use of carriers which are provided together in an interconnected assembly is particularly suitable for this. The carriers are preferably only separated from one another after the completion of the plurality of laser diode components.

With particular advantage, a test operation of the laser diode components is carried out before the singulation of the carriers, to determine and filter out early failures among the components. Being together in an interconnected assembly allows a number of laser diode components to be jointly brought into position for this and connected in an electrically conducting manner in a technically simple way.

In the case of an expedient embodiment of the method, a covering body is fitted on the holding device.

In the method, the carrier is preferably provided in two separate parts, of which a first part is provided on at least a first side with a first hard solder layer and is placed with this first hard solder layer onto a second part of the carrier and connected to the second part by heat being supplied. With particular preference, the first part of the carrier is provided on a second side, opposite from the first side, with a second hard solder layer. The mounting of the laser diode chip or laser diode bar in this case comprises placing the latter on the second hard solder layer and connecting it to the first part of the carrier by heat being supplied.

By this method it is advantageously possible in particular to carry out the connecting of the first part to the second part and the mounting of the laser diode chip or laser diode bar simultaneously. This can be carried out in a technically simple manner and, moreover, is conducive to low-cost production of the laser diode component. In general terms, parts of the carrier are connected to one another and a laser diode chip or laser diode bar is connected to the carrier substantially simultaneously by a stack soldering process.

BRIEF DESCRIPTION OF THE DRAWINGS

Further advantages, preferred embodiments and developments of the package, the laser diode component and the method emerge from the exemplary embodiments explained below in conjunction with FIGS. 1 to 7d, in which:

FIGS. 14 and 15 show schematic sectional views of various method stages of another exemplary embodiment of the method.

DETAILED DESCRIPTION OF THE DRAWINGS

Figure 1:
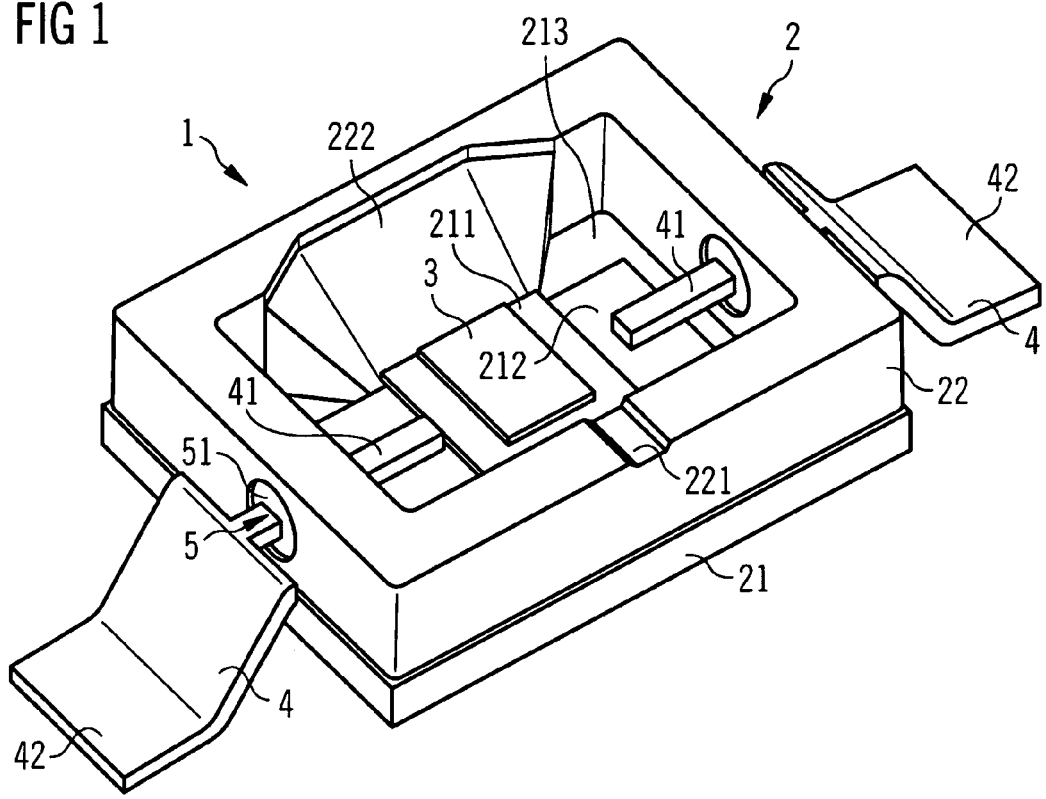
FIG. 1 shows a schematic perspective representation of the laser diode component with the package according to a first exemplary embodiment.

In the exemplary embodiments and figures, component parts that are the same or have the same effect are in each case provided with the same reference numerals. The component parts represented and the sizes of the component parts in relation to one another are not necessarily to be regarded as true to scale. Rather, some details of the figures may be shown exaggerated for better understanding.

The laser diode component 1 represented in FIG. 1 is a laser module. It comprises a package 2 with a carrier 21 and a holding device 22.

The holding device 22 is formed as a frame for the package 2. It has an aperture 5 on each of two sides lying opposite each other. The aperture 5 takes the form of an opening, for example a through-hole. It extends from an outer side to an inner side of the holding device. The holding device, formed in a frame-like manner, encloses a central region of the front side of the carrier 21 in such a way that a cavity is formed. Arranged in this cavity, for example, is a luminescence diode chip 3.

Electrical terminal conductors 4 are respectively inserted in the apertures 5. They are fixed in the apertures by means of a filling compound 51. The filling compound includes glass, for example, or consists of glass. The glass, for example based on silicon dioxide, is electrically insulating, so that the electrical terminal conductors 4 are electrically insulated from the holding device 22. This allows the holding device 22 to include an electrically conductive material or consist of such a material, without there necessarily being the risk of a short-circuit between the terminal conductors 4.

The holding device 22 consists for example of a metallic material, such as for instance an alloy which includes cobalt, nickel and iron. Particularly suitable is an alloy with a composition of 17% cobalt, 29% nickel and 54% iron. This alloy has a low coefficient of thermal expansion and is particularly suitable for glass-metal connections. Alternatively, an alloy which includes nickel and iron may be used. It has, for example, a composition of 42% nickel and 58% iron.

In addition or alternatively, the holding device 22 may also include a ceramic material, such as for example aluminum nitride, or consist of such a material.

The electrical terminal conductors have in each case a narrow region 41 and a wide region 42. They are inserted with the narrow region in the apertures 5, so that the wide region is respectively arranged on the outer side, that is to say outside the holding device 22 formed in a frame-like manner.

The narrow region 41 protrudes partially into the interior of the package. In precisely the same way as the entire electrical terminal conductor 4, it is kept at a distance from the carrier and protrudes freely over the front side of the carrier, that is to say that, between the front side of the carrier 21 and the part of the narrow region 41 protruding over it, there is an intermediate space which is free of solid material.

In the exemplary embodiment represented in FIG. 1, the electrical terminal conductors 4 are exclusively held by the holding element 22. Consequently, when an electrically insulating filling compound 51 is used, they are not only electrically insulated from the holding element 22, but in principle also from the carrier 21. An electrically conductive connection of a terminal conductor to an electrically conductive part of the carrier is formed in the laser diode component 1, for example by means of a bonding wire 31.

That part of the narrow region 41 of the electrical terminal conductor 4 that protrudes into the interior of the package forms a chip connection region, by means of which a laser diode inside the package can be connected in an electrically conducting manner. The wide regions 42 are, for example, kept laterally away from the carrier 21 and from the holding device 22.

The wide regions 42 are, for example, respectively bent in such a way that their outer part extends substantially in the same plane as the rear side of the carrier, so that the component is designed to be surface mountable. Surface mountable means that the component can be electrically and mechanically mounted on a suitable surface without for example complex plug-in mounting being necessary.

Figure 2:
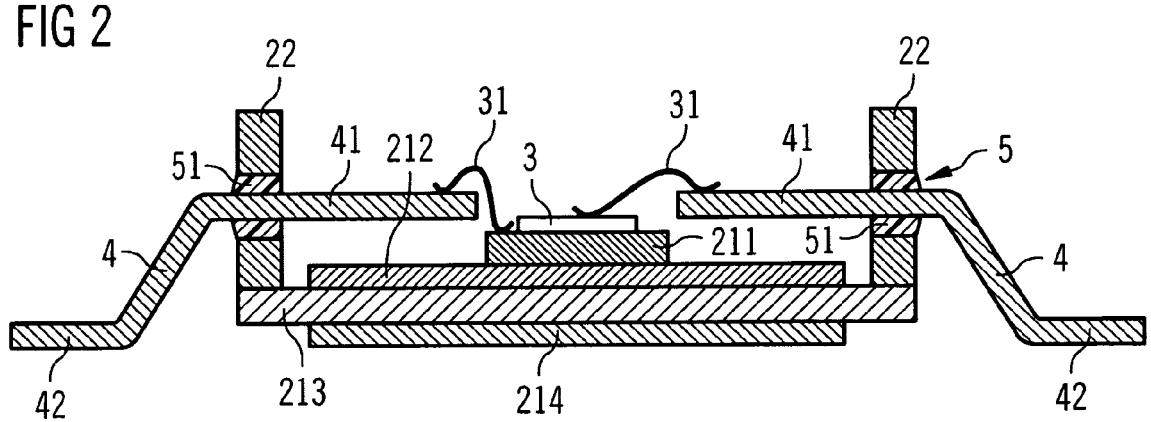
FIG. 2 shows a schematic sectional view of the laser diode component represented in FIG. 1 taken along a centered vertical plane along its length.

The construction of the carrier 21 that is given by way of example can be seen particularly well from the sectional view represented in FIG. 2. In the example represented there, the carrier has substantially four carrier plates or carrier layers 211, 212, 213, 214. It comprises, for example, a DCB substrate (direct copper bonding substrate). Instead of a multi-layered construction, however, the carrier may for example also have only a single layer or plate, which consists for example of ceramic material such as aluminum nitride or of a metallic material. Aluminum nitride is of advantage on account of its low procurement costs and its high thermal conductivity. As an alternative, the carrier may for example also include silicon or silicon carbide.

The carrier represented in FIG. 2 has, for example, a third carrier layer 213 of ceramic material, such as aluminum nitride. The front side and rear side of the first carrier layer 213 are provided with a second carrier layer 212 and a fourth carrier layer 214, which for example include a metallic material such as copper or consist of such a material.

Arranged on the second carrier layer 212, which is arranged on the front side of the first carrier layer 213, there is for example a first carrier layer 211, which serves as a submount. The first carrier layer 211 consists for example of an electrically insulating material such as aluminum nitride and is provided on its front side with a metal layer, which for example includes gold and/or tin. The metal layer forms a mounting region in the form of a mounting area, for example for a laser diode chip 3.

It is also possible to form the carrier 21 without the first carrier layer 211 and for example to mount the laser diode chip 3 directly on the second carrier layer 212 lying thereunder.

As a further alternative, it is also possible for the carrier to have a single metal plate. The same materials as those specified above in connection with the holding device 22 come into consideration as metallic materials.

The laser diode chip 3 is connected in an electrically conducting manner to the terminal conductors 4, for example by means of second bonding wires 31, the front side of the laser diode chip 3 being contacted directly by means of the bonding wire and the rear side being connected in an electrically conducting manner to the metal coating applied to the first carrier layer 211, which coating is in turn connected in an electrically conducting manner to the second terminal conductor by means of a bonding wire.

The design of the package 2 or of the laser diode component 1 allows it to be connected both electrically and thermally in one and the same plane. The thermal connection of the package 2 is formed for example by the rear side of the carrier 21, which would substantially be the rear side of the lowermost layer 214 with reference to the sectional view represented in FIG. 2.

Since the component connection parts of the electrical terminal conductors 4 are in each case kept laterally at a distance from the carrier 21, the electrical and thermal connection take place independently of each other, which, among other things, is of advantage for allowing the thermal connection to be mounted.

As represented in FIG. 1, the holding device 22 has a reflector bevel 222. The reflector bevel 222 or the entire holding device 22 are provided for example with a highly reflective layer, for example with a gold layer. This allows the reflector bevel 222 to serve as a deflecting element in the component package, so that the component is also suitable in particular for edge-emitting laser diodes which are mounted in the package in such a way that their active zone is aligned substantially parallel to a plane of principal extent of the carrier.

The reflector bevel 222 is, for example, impressed in the holding device 22. This is possible in particular if at least a corresponding part of the holding device 22 consists of metallic material. However, the incorporation of a reflector bevel in the holding device 22 is in principle also possible when other materials are used, such as for example ceramic material.

Apart from the two apertures 5, the holding device 22 additionally has a ventilation aperture 221 in the form of a clearance on a side of the holding device that is facing away from the carrier 21. The ventilation aperture 221 is suitable for providing compensation with respect to pressure, temperature and atmospheric humidity if the package 2 were completely covered on its front side by means of a covering body.

Figure 3:
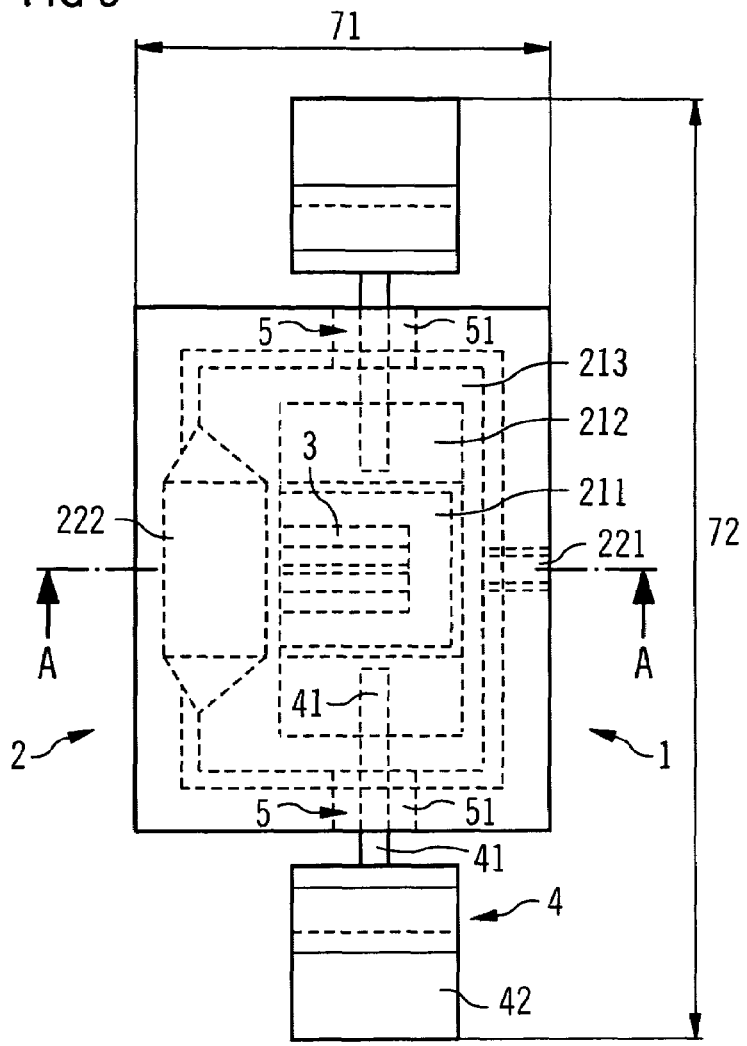
FIG. 3 shows a schematic plan view of a laser diode component with a package according to a second exemplary embodiment.
Figure 4:
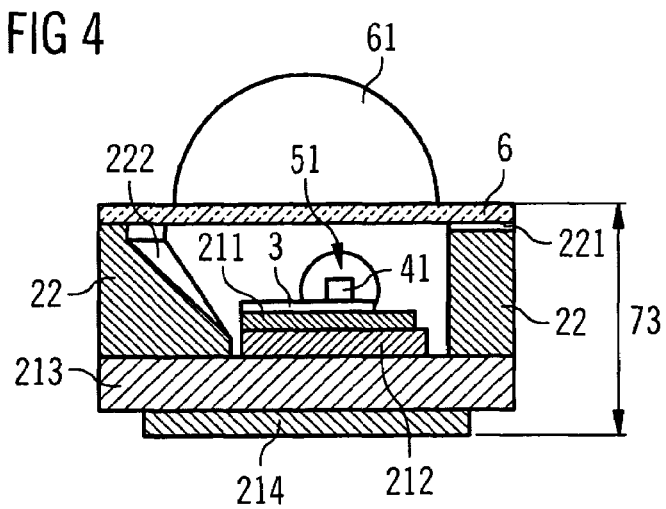
FIG. 4 shows a schematic sectional view of the laser diode component represented in FIG. 3 taken along line A-A.
Figure 5:
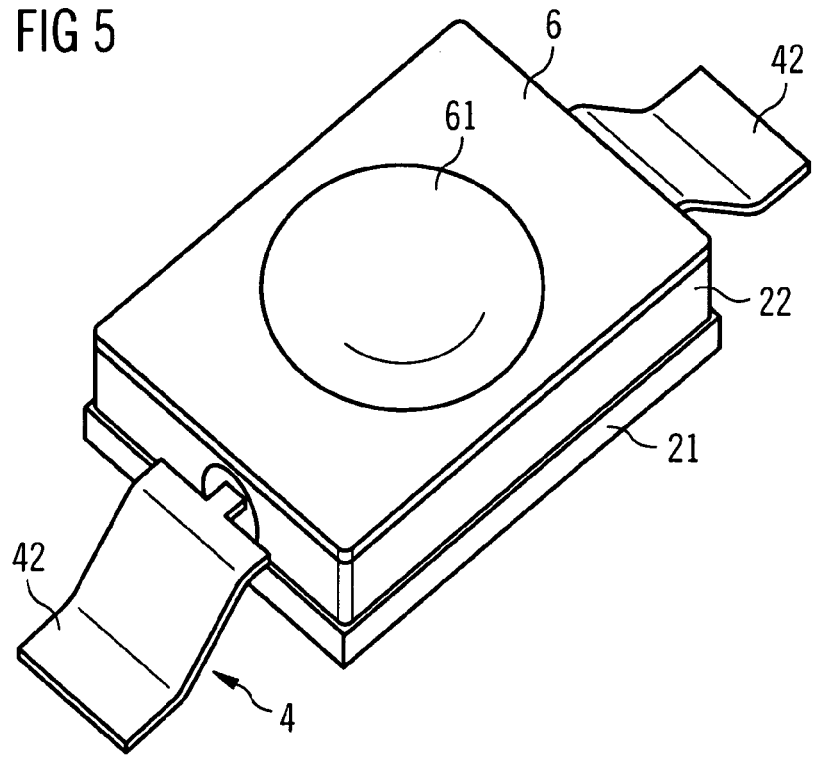
FIG. 5 shows a schematic perspective representation of the laser diode component represented in FIGS. 3 and 4.

A laser diode component 1 with such a covering body is represented in FIGS. 3 to 5. This has a covering plate 6 with a lens 61. The covering plate 6 and the lens 61 may for example consist of the same material, for example of a glass which is based on or consists of silicon dioxide. They may, moreover, be formed in one piece with each other. Alternatively, it is possible for them to be designed as separate parts and for the lens 61 to be placed on the covering plate 6.

Otherwise, the laser diode component represented in FIGS. 3 to 5 is designed in a way similar to the exemplary embodiment explained above on the basis of FIGS. 1 and 2. It may in particular include the same materials.

An edge-emitting laser diode bar 3 is mounted in the package 2. Laser diodes which emit in the infrared range come into consideration for example. These have, for example, an epitaxial semiconductor layer sequence with an active zone emitting electromagnetic radiation on the basis of gallium arsenide (GaAs) or aluminum gallium arsenide (AlGaAs). It is also possible to use laser diodes based on InAlGaN, which for example emit blue light and/or electromagnetic radiation from the ultraviolet range. Possible embodiments and the production of suitable laser diodes are known to a person skilled in the art.

Figure 6:
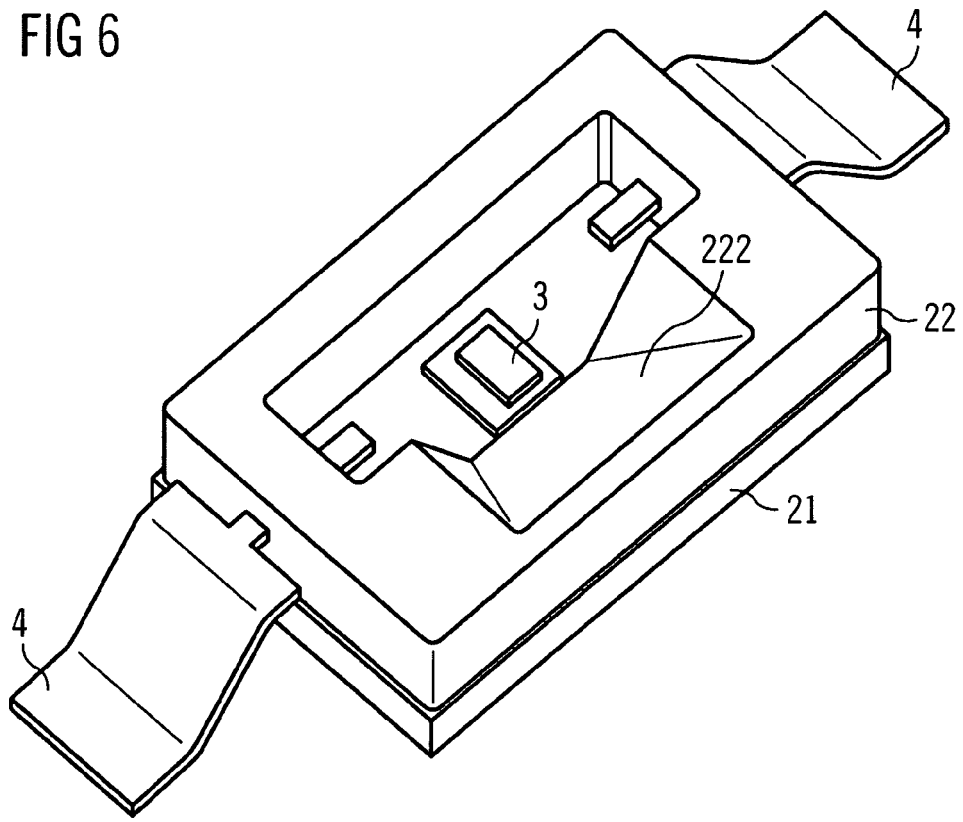
FIG. 6 shows a schematic perspective representation of a laser diode component according to a third exemplary embodiment.

The laser diode component 1 has a length 72 of between 8 mm and 13 mm, inclusive; for example, the length is 10.5 mm. The length of the carrier 21 is, for example, 6 mm. The width 71 of the laser diode component comprises between 3 and 6 mm, inclusive, for example 4.5 mm. The height 73 of the laser diode component is, for example, between 2 mm and 4 mm, inclusive, for example 2.5 mm, the lens 61 that is represented in FIGS. 4 and 6 not being taken into account.

The laser diode component represented in FIG. 5 is designed in a way similar to the exemplary embodiments described above. One difference from the exemplary embodiment explained above on the basis of FIGS. 1 to 4 is that the holding device 22 is made much wider on the side of the reflector bevel 222 than on the opposite side. This allows the reflector bevel 222 to be incorporated in the holding device 22 also by material removal instead of by impression.

Various exemplary embodiments of covering plates 6 with different optical elements 61 are represented in FIGS. 8 to 11. The optical elements each have a plurality of structural elements 62.

Figure 8:
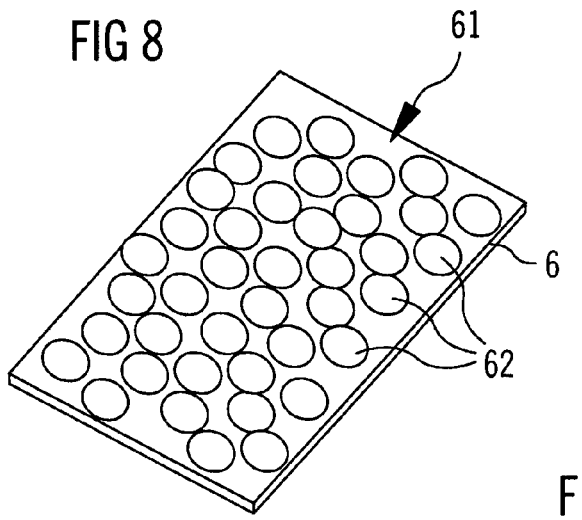
FIG. 8 shows a schematic perspective representation of a covering plate for a laser diode component with an optical element according to an exemplary embodiment of an optical element.

In the case of the exemplary embodiment represented in FIG. 8, the structural elements 62 are a multiplicity of microlenses. These are irregularly arranged, but may alternatively also be regularly arranged.

Figure 9:
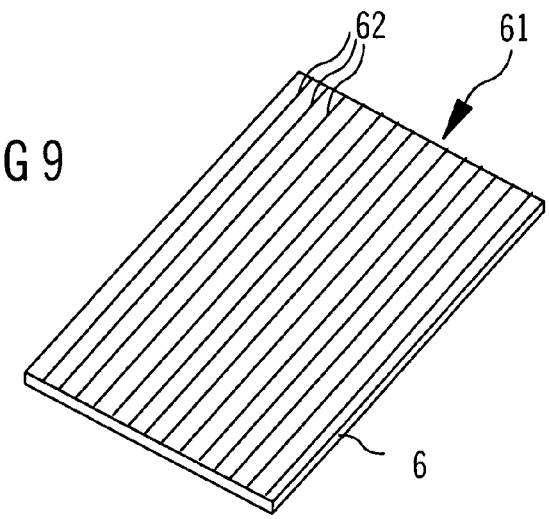
FIG. 9 shows a schematic perspective representation of a covering plate for a laser diode component with an optical element according to another exemplary embodiment of an optical element.

The optical element 61 contained in FIG. 9 has a multiplicity of optical line structures, which are indicated by the lines represented. The line structures may be, for example, structures such as of cylindrical lenses.

Figure 10:
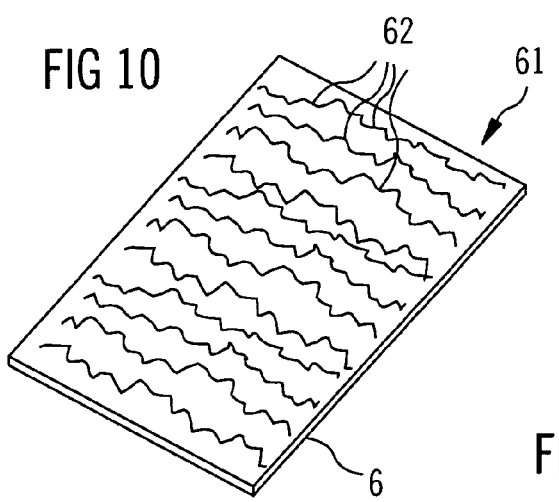
FIG. 10 shows a schematic perspective representation of a covering plate for a laser diode component with an optical element according to another exemplary embodiment of an optical element.

The optical element 61 contained in FIG. 10 has structural elements 62 in the form of a roughening. The size and depth of the roughening are great enough for a laser radiation that is to be emitted to be diffused at it. This allows homogenization of a laser beam that is to be emitted to be achieved.

Figure 11:
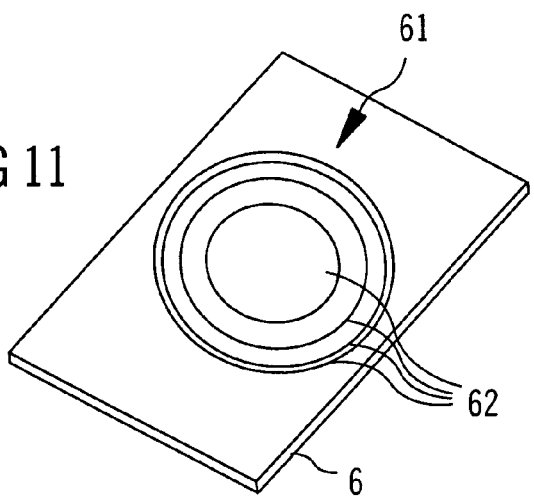
FIG. 11 shows a schematic perspective representation of a covering plate for a laser diode component with an optical element according to another exemplary embodiment of an optical element.

The optical element 61 contained in FIG. 11 has structural elements 62 for a Fresnel lens.

The structural elements may be respectively arranged both on a light entry side and on a light exit side of the covering plate 6. They may in particular also be included on both sides, it being possible for the structural elements to be formed similarly or differently on the two sides.

Moreover, combinations of the structural elements represented are possible. For example, the structural elements represented in FIGS. 8, 9 and 11 may in each case be superposed with a roughening, as schematically represented in FIG. 10. Moreover, the structures such as for a Fresnel lens may for example also be formed in a linear manner, instead of a circular manner, or in some other form. The optical elements are, in particular, suitable for homogenizing a laser beam to be emitted.

Figure 12:
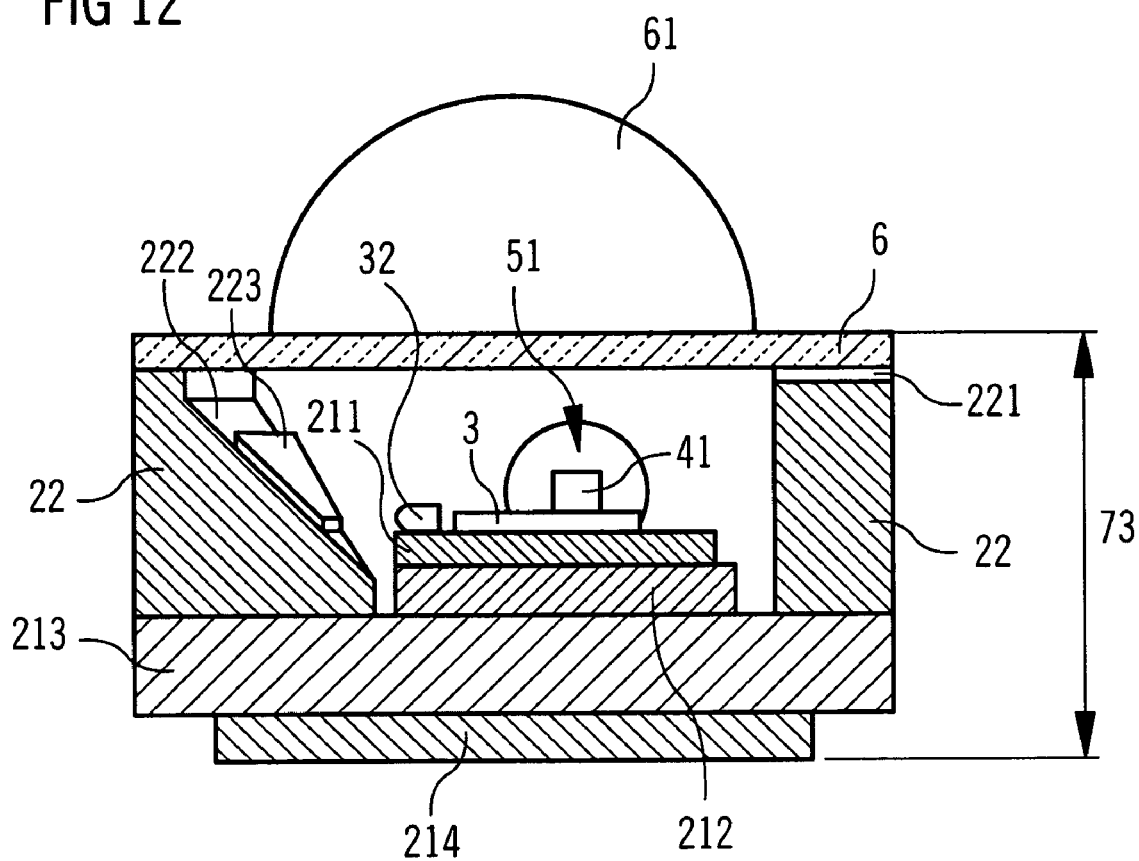
FIG. 12 shows a schematic sectional view of a laser diode component according to a fourth exemplary embodiment.

As a difference from the exemplary embodiment described above on the basis of FIGS. 3 to 5, in the case of the laser diode component represented in FIG. 12, an optical system 32 is arranged on the first carrier layer 211. The optical system is, for example, a cylindrical lens which is adhesively attached on the first carrier layer 211. For the use of such an optical system, the special multilayered construction of the carrier is not absolutely necessary, although it may also be of advantage for this. The optical system 32 is arranged in the beam path of the laser diode chip or laser diode bar 3.

In the case of the laser diode component represented in FIG. 12, a reflector plate 223 is fitted on the reflector bevel 222. This has for example a glass plate which is provided with a Bragg mirror. The Bragg mirror has a dielectric layer sequence which has alternating dielectric layers with different refractive indices. For example, six layer sequences each with a layer of silicon and a layer of aluminum oxide are contained. The layers have a thickness which corresponds to one quarter or one half of the wavelength of the electromagnetic radiation to be reflected. Instead of using a reflector plate 223 such as this, it is also possible in principle to provide the reflector bevel directly with such a Bragg mirror.

Figure 13:
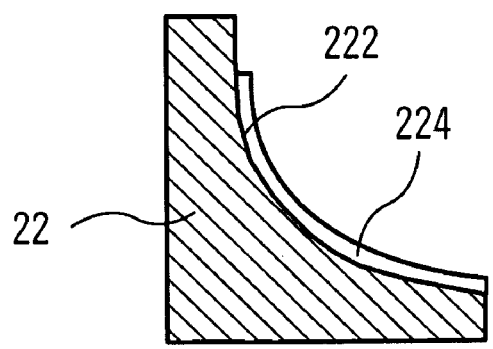
FIG. 13 shows a schematic sectional view of a holding device for a laser diode component according to a fifth exemplary embodiment.

An example of such a reflector bevel 222 provided directly with a Bragg mirror is contained in the detail of a holding element 22 that is represented in FIG. 13. The reflector bevel has a concave curvature and is provided with a reflective material 224. This may be, for example, a dielectric layer sequence for a Bragg mirror or else a reflective metallic material. Moreover, the reflective material 224 may have a combination of a reflective layer with a metallic material and a dielectric layer sequence for a Bragg mirror.

In the case of the exemplary embodiment illustrated in FIG. 12, a Bragg mirror is for example also contained in the covering plate 6. Like the Bragg mirror described above, this may be formed for example for the reflector bevel. With the Bragg mirror, electromagnetic radiation of a desired, narrow frequency range can be selectively reflected. The Bragg mirror may form an external resonator mirror for the laser diode chip or laser diode bar, by means of which a desired frequency range of the laser diode chip that is to be emitted can be set. Such an external resonator mirror allows for example temperature influences on the laser diode component to be at least partially compensated.

Figure 7A:
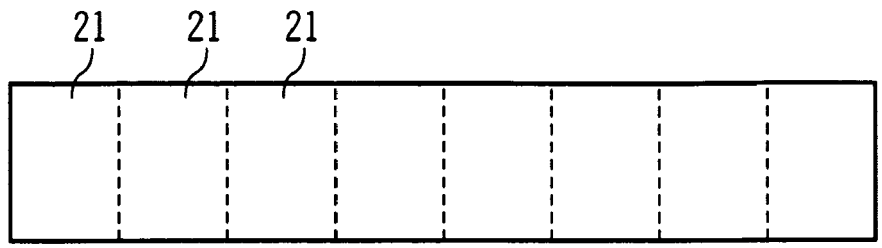
FIG. 7a to d show a schematic plan view of a plurality of carriers together in an interconnected assembly during various method stages of an exemplary embodiment of the method.

Represented in FIG. 7a are a plurality of carriers 21 for a package, which are together in an interconnected assembly. In this interconnected assembly, the carriers 21 are arranged in a strip-like manner one behind the other or one next to the other.

Figure 7B:
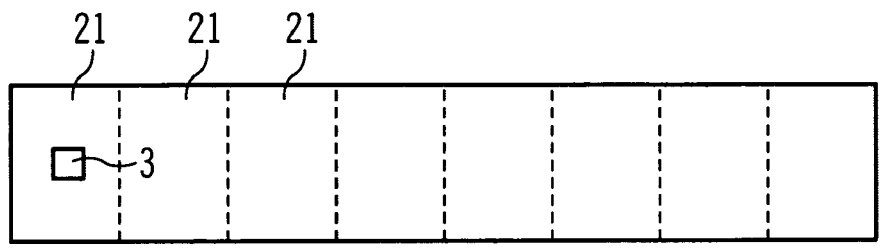

After providing such an interconnected carrier assembly, according to an exemplary embodiment of the method at least one laser diode chip or laser diode bar 3 is electrically and mechanically mounted on the carrier 21, which in FIG. 7b is represented by way of example for only a single carrier 21 of the interconnected carrier assembly. The laser diode is mounted for example by means of soldering.

Figure 7C:
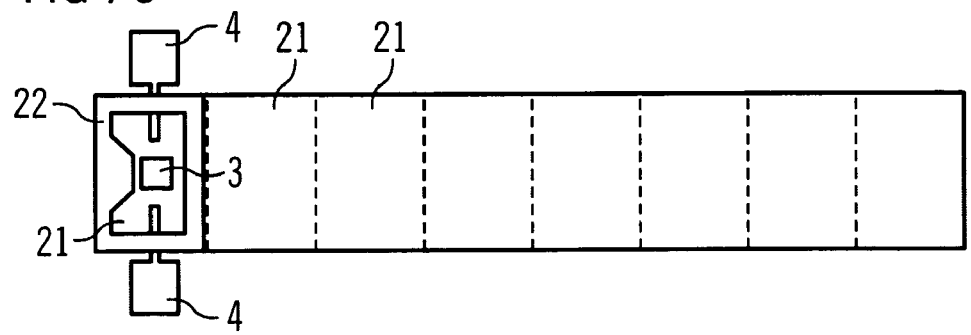

After mounting of the laser diode 3, a holding device 22 is fitted on the carrier 21, see FIG. 7c. The holding device 22 is formed in a frame-like manner. Two electrical terminal conductors 4 are held in it or on it. The holding device 22 and the terminal conductors 4 may be designed as in the exemplary embodiment described above.

Figure 7D:
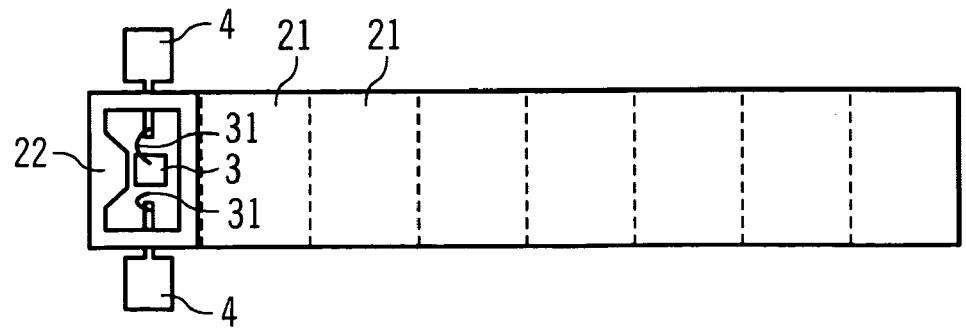

In a further method step, the electrical terminal conductors 4 are connected in an electrically conducting manner to the connection sides of the laser diode chip or laser diode bar 3, which takes place for example by bonding by means of bonding wires 31, see FIG. 7d. Subsequently, a covering plate may for example be fitted on the holding device 22. After fitting on the holding device 22, the carriers 21 are separated from one another by a suitable singulating process. This may take place for example by sawing.

In a way similar to the carriers 21, it is also possible for a number of holding devices 22 to be provided together in an interconnected assembly and to be applied together to the interconnected carrier assembly and singulated together with the interconnected carrier assembly.

In the case of the exemplary embodiment of the method that is illustrated in FIGS. 14 and 15, a first part 218 and a second part 219 of a carrier 21 are provided. The second part 219 may in particular be in an interconnected assembly with a multiplicity of further second parts 219 for a carrier. In this case, it is expedient to provide a corresponding number of separate first parts 218, to produce a plurality of laser diode components substantially simultaneously.

The first part 218 is provided on a first side with a first hard solder layer 215 and on a second side, opposite from the first side, with a second hard solder layer 216. The hard solder of the hard solder layers 215, 216 preferably includes a gold-tin alloy. The hard solder layers 215, 216 have, for example, a thickness of 2 μm.

In the method, moreover, a laser diode chip or laser diode bar is provided.

In a further method step, the laser diode chip or laser diode bar 3, the first carrier part 218 and the second carrier part 219 are connected to one another by means of "stack soldering". For this purpose, the first part 218 is applied to the second part 219 by the first hard solder layer 215 and the laser diode chip or laser diode bar 3 is applied to the second hard solder layer 216. Subsequently, the previously loose parts are soldered together by means of heat being supplied. For this purpose, the temperature is increased to, for example, approximately 330° C.

The second part 219 of the carrier has a second carrier layer 212, a third carrier layer 213 and a fourth carrier layer 214. The second carrier layer 212 and the fourth carrier layer 214 consist of a metallic material, for example of copper. The third carrier layer 213, arranged between these layers, includes a ceramic material, for example consists of aluminum nitride. The middle layer of the second part of the carrier 219, that is to say the third carrier layer 213 with the ceramic material, has a significantly lower coefficient of expansion than the adjacent carrier layers 212, 214.

The three carrier layers are firmly connected to one another, so that the low coefficient of expansion of the third carrier layer 213 is transferred at least partially to the adjacent metallic carrier layers 212, 214. As a result, the risk of the hard solder layer 215 rupturing is significantly reduced. A particularly good thermal bonding of the parts to be connected is possible by means of hard soldering. On the other hand, hard soldering is generally not customary for connecting a part on metal, since the hard solder threatens to rupture in such a case on account of the high coefficients of expansion of metals. Instead, such connections have previously been realized by using a soft solder.

As an alternative to the exemplary embodiment of the method that is described, it is also possible to omit the first part 218 of the carrier and to connect the laser diode chip or laser diode bar 3 to the second part 219 of the carrier directly by means of hard soldering.

The invention is not restricted by the description of the invention on the basis of the exemplary embodiments to these embodiments. Rather, the invention comprises any novel feature and any combination of features, which includes in particular any combination of features in the patent claims, even if this feature or this combination is not itself explicitly specified in the patent claims or exemplary embodiments.

I claim:

1. A package for a laser diode component comprising:
   a carrier, which has on a front side thereof a mounting region for a laser diode chip or laser diode bar;
   at least one holding device including at least one aperture and comprising a metallic and/or ceramic material, said at least one holding device being arranged on said carrier and having a reflector bevel, which runs obliquely in relation to a plane of principal extent of the carrier; and
   an electrical terminal conductor held in said at least one aperture.

2. The package as claimed in claim 1, a component connection part of the electrical terminal conductor is laterally at a distance from the carrier.

3. The package as claimed claim 1, wherein the carrier is formed as a heat dissipating element having on a rear side, opposite from the front side, a thermal connection area.

4. The package as claimed in claim 3, wherein the thermal connection area is electrically insulated from the electrical terminal conductor of the package.

5. The package as claimed in claim 1, wherein the carrier comprises ceramic and/or metallic material.

6. The package as claimed in claim 1, wherein the electrical terminal conductor is at a distance from the carrier.

7. The package as claimed in claim 1, wherein a chip connection part of the electrical terminal conductor protrudes freely over the front side of the carrier.

8. The package as claimed in claim 1, wherein the electrical terminal conductor is held in the aperture by means of a filling material.

9. The package as claimed in claim 1, wherein the electrical terminal conductor is inserted in the aperture.

10. The package as claimed in claim 8, wherein the filling material is electrically insulating.

11. The package as claimed in claim 1, wherein the electrical terminal conductor comprises a wide part and a narrow part, the narrow part having a smaller width than the wide part and being held in the aperture in such a way that the wide part is arranged on the outer side of the holding device.

12. The package as claimed in claim 1, wherein the holding device consists substantially of metallic material.

13. The package as claimed in claim 1, wherein the holding device includes at least one of the materials of nickel, iron and cobalt and an alloy with at least two of these materials.

14. The package as claimed in claim 1, wherein the holding device and the earner are separate parts.

15. The package as claimed in claim 1, wherein at least two electrical terminal conductors are held in an aperture of the at least one holding device.

16. The package as claimed in claim 1, wherein the holding device has a coating which is suitable for reflecting electromagnetic radiation.

17. The package as claimed in claim 16, wherein the coating consists of metallic material.

18. The package as claimed in claim 16, wherein the coating has a layer sequence for a Bragg mirror.

19. The package as claimed in claim 1, wherein the holding device is a frame for the package.

20. The package as claimed in claim 19, wherein the frame has a ventilation aperture.

21. The package as claimed in claim 1, wherein the reflector bevel is impressed in the holding device.

22. The package as claimed in claim 1, wherein a reflector plate is arranged on the reflector bevel.

23. The package as claimed in claim 1, wherein the reflector bevel has a concave curvature.

24. The package as claimed in claim 1, wherein the carrier has a first carrier layer with a mounting region for a laser diode chip or a laser diode bar, and wherein the first carrier layer is connected on a side facing away from the mounting region to a second carrier layer of the carrier by means of a hard solder.

25. The package as claimed in claim 24, wherein the second carrier layer comprises a metallic material.

26. The package as claimed in claim 1, wherein the carrier has two carrier layers with metallic material and a carrier layer with ceramic material arranged between these carrier layers.

27. The package as claimed in claim 1, wherein the package is suitable for a laser diode component with a thermal power loss of greater than or equal to 3 watts.

28. The package as claimed in claim 1, wherein the package is suitable for a laser diode component with a power loss of greater than or equal to 6 watts.

29. A laser diode component with a package as claimed in claim 1, which has at least one laser diode chip or laser diode bar.

30. The laser diode component as claimed in claim 29, wherein the laser diode chip or the laser diode bar is formed as an edge emitter.

31. The laser diode component as claimed in claim 29, which has a power loss of greater than or equal to 3 watts.

32. The laser diode component as claimed in claim 29, which has a power loss of greater than or equal to 6 watts.

33. The laser diode component as claimed in claim 29, wherein a covering body is fitted on the holding device.

34. The laser diode component as claimed in claim 33, wherein the covering body is formed as an optical element or an optical element is arranged on the covering body.

35. The laser diode component as claimed in claim 34, wherein the optical element has a number of structural elements.

36. The laser diode component as claimed in claim 35, wherein the structural elements comprise one or more microlenses, line structures, Fresnel lenses and/or roughenings.

37. The laser diode component as claimed in claim 34, wherein the covering body has a layer sequence for a Bragg mirror.

38. The laser diode component as claimed in claim 29, wherein an optical system is arranged on the carrier and in a beam path of the laser diode chip or laser diode bar.

39. A method for producing a laser diode component which is designed for surface mounting, the method comprising the steps of:
   providing a carrier;
   mounting a laser diode chip or laser diode bar on the carrier;
   providing at least one holding device, in which a reflector bevel is incorporated;
   forming at least one aperture in the holding device;
   fastening an electrical terminal conductor in the aperture; and
   placing the holding device on the carrier.

40. The method as claimed in claim 39, in which the carrier is provided in an interconnected assembly with a multiplicity of further carriers.

41. The method as claimed in claim 39, in which a plurality of identical or similar laser diode components are produced substantially simultaneously.

42. The method as claimed in claim 39, in which a covering body is fitted on the holding device.

43. The method as claimed in 39, wherein the carrier is provided in two separate parts, of which a first part is provided on at least a first side with a first hard solder layer and said first part is placed with the first hard solder layer onto a second part of the carrier and connected to the second part by heat being supplied.

44. The method as claimed in claim 43, wherein the first part is provided on a second side, opposite from the first side, with a second hard solder layer and the mounting of the laser diode chip or laser diode bar comprising placing the latter on the second hard solder layer and connecting it to the first part of the carrier by heat being supplied.

45. A method for producing a laser diode component which is designed for surface mounting, the method comprising the steps of:
providing a carrier with a holding device arranged on it, the holding device having a reflector bevel;
forming at least one aperture in the holding device;
fastening an electrical terminal conductor in the aperture; and
mounting a laser diode chip or laser diode bar on the carrier.

46. The method as claimed in claim 45, in which the carrier is provided in an interconnected assembly with a multiplicity of further carriers.

47. The method as claimed in claim 45, in which a plurality of identical or similar laser diode components are produced substantially simultaneously.

48. The method as claimed in claim 45, in which a covering body is fitted on the holding device.

49. The method as claimed in 45, wherein the carrier is provided in two separate parts, of which a first part is provided on at least a first side with a first hard solder layer and said first part is placed with the first hard solder layer onto a second part of the carrier and connected to the second part by heat being supplied.

50. The method as claimed in claim 49, wherein the first part is provided on a second side, opposite from the first side, with a second hard solder layer and the mounting of the laser diode chip or laser diode bar comprising placing the latter on the second hard solder layer and connecting it to the first part of the carrier by heat being supplied.

51. The package as claimed in claim 1, wherein the package is adapted for surface mounting.

52. A laser diode component comprising:
at least one laser diode chip or laser diode bar;
a carrier, which has on a front side thereof a mounting region for said laser diode chip or laser diode bar;
at least one holding device defining at least one aperture and comprising a metallic and/or ceramic material, the at least one holding device being arranged on said carrier; and
an electrical terminal conductor held in said at least one aperture;
a covering body is fitted on the at least one holding device, the covering body being formed as an optical element or an optical element being arranged on the covering body.

53. The laser diode component as claimed in claim 52, wherein the optical element has a number of structural elements.

54. The laser diode component as claimed in claim 53, wherein the structural elements comprise one or more microlenses, line structures, Fresnel lenses and/or roughenings.

55. The laser diode component as claimed in claim 52, wherein the covering body has a layer sequence for a Bragg mirror.

56. The package as claimed in claim 1, wherein the at least one holding device has an inner wall defining a cavity for receiving a laser diode component, and wherein a portion of the inner wall is beveled to form the reflector bevel.

57. The package as claimed in claim 1, wherein the at least one holding device has an inner side arranged on the front side of the carrier, an opposing outer side, and at least one wall extending between the inner and outer sides, a portion of the wall being beveled to form the reflector bevel.

* * * * *